(12) United States Patent
Qin et al.

(10) Patent No.: US 12,232,354 B2
(45) Date of Patent: Feb. 18, 2025

(54) FLEXIBLE DISPLAY PANEL HAVING STRESS ABSORPTION FUNCTION AND MANUFACTURING METHOD OF FLEXIBLE DISPLAY PANEL

(71) Applicant: TCL CHINA STAR OPTOELECTRONICS TECHNOLOGY CO., LTD., Guangdong (CN)

(72) Inventors: Shijian Qin, Guangdong (CN); Ziming Zheng, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 536 days.

(21) Appl. No.: 17/597,234

(22) PCT Filed: Dec. 16, 2021

(86) PCT No.: PCT/CN2021/138900
§ 371 (c)(1),
(2) Date: Dec. 29, 2021

(87) PCT Pub. No.: WO2023/103018
PCT Pub. Date: Jun. 15, 2023

(65) Prior Publication Data
US 2023/0180511 A1    Jun. 8, 2023

(30) Foreign Application Priority Data

Dec. 8, 2021   (CN) .......................... 202111491251.0

(51) Int. Cl.
*H10K 50/844*   (2023.01)
*H10K 50/125*   (2023.01)
(Continued)

(52) U.S. Cl.
CPC ......... *H10K 50/844* (2023.02); *H10K 50/125* (2023.02); *H10K 50/15* (2023.02);
(Continued)

(58) Field of Classification Search
CPC .... H10K 50/844; H10K 50/125; H10K 50/15; H10K 50/16; H10K 71/00; H10K 2102/311; Y02E 10/549
See application file for complete search history.

(56) References Cited

U.S. PATENT DOCUMENTS

| 6,281,617 B1 | 8/2001 | Qiu et al. |
| 10,910,604 B2 * | 2/2021 | Cheng .................... H10K 59/32 |

(Continued)

FOREIGN PATENT DOCUMENTS

| CN | 105609533 A | 5/2016 |
| CN | 105807475 A | 7/2016 |

(Continued)

OTHER PUBLICATIONS

International Search Report issued in International application No. PCT/CN2021/138900, mailed May 7, 2022, with English translation.

(Continued)

*Primary Examiner* — Caleb E Henry
(74) *Attorney, Agent, or Firm* — HSML P. C.

(57) ABSTRACT

A flexible display panel and a manufacturing method of the flexible display panel are provided. Wherein, the flexible display panel includes: a light-emitting layer, wherein the light-emitting layer includes a light-emitting surface; a mechanoluminescence layer, wherein the mechanoluminescence layer is disposed on the side of the light-emitting surface of the light-emitting layer, and the mechanoluminescence layer is configured to absorb the stress which is generated when the flexible display panel is bent, to convert (Continued)

the stress into the optical signal, and to emit the optical signal. A problem that a stress concentration region of the flexible display panel is prone to failure is solved.

18 Claims, 4 Drawing Sheets (51) Int. Cl.
   *H10K 50/15* (2023.01)
   *H10K 50/16* (2023.01)
   *H10K 71/00* (2023.01)
   *H10K 102/00* (2023.01)

(52) U.S. Cl.
   CPC ............. *H10K 50/16* (2023.02); *H10K 71/00* (2023.02); *H10K 2102/311* (2023.02)

(56) References Cited

U.S. PATENT DOCUMENTS

| | | | |
|---|---|---|---|
| 11,217,156 B2* | 1/2022 | He | H10K 50/844 |
| 2012/0161197 A1 | 6/2012 | Im et al. | |
| 2015/0242057 A1 | 8/2015 | Galela et al. | |
| 2016/0126496 A1* | 5/2016 | Wang | H10K 50/82 |
| | | | 257/40 |
| 2016/0308158 A1* | 10/2016 | Guo | H10K 30/865 |
| 2017/0194592 A1* | 7/2017 | Jiang | H10K 77/111 |
| 2017/0229674 A1* | 8/2017 | Jin | H10K 59/8731 |
| 2018/0342707 A1* | 11/2018 | Lee | H10K 77/111 |
| 2019/0156709 A1* | 5/2019 | Li | H10K 50/81 |
| 2021/0074935 A1* | 3/2021 | Zheng | H10K 59/131 |

FOREIGN PATENT DOCUMENTS

| | | |
|---|---|---|
| CN | 106910838 A | 6/2017 |
| CN | 206282888 U | 6/2017 |
| CN | 109307566 A | 2/2019 |
| CN | 109443630 A | 3/2019 |
| CN | 111129087 A | 5/2020 |
| CN | 111430432 A | 7/2020 |
| CN | 111628087 A | 9/2020 |
| CN | 111959078 A | 11/2020 |
| CN | 112213815 A | 1/2021 |
| KR | 101717471 B1 | 3/2017 |
| WO | 2021117076 A1 | 6/2021 |

OTHER PUBLICATIONS

Written Opinion issued in International application No. PCT/CN2021/138900, mailed May 7, 2022, with English translation.
Chinese Office Action issued in corresponding Chinese Patent Application No. 202111491251.0 dated Apr. 27, 2024, , with machine translation; 22 pages provided.

* cited by examiner

```
┌─────────────────────────────────────────────────┐
│ manufacturing the light-emitting layer, wherein the light- │──── 101
│ emitting layer includes a light-emitting surface │
└─────────────────────────────────────────────────┘
                          │
                          ▼
┌─────────────────────────────────────────────────┐
│ disposing a mechanoluminescence sub on the side of the │
│ light-emitting surface of the light-emitting layer, wherein │
│ the mechanoluminescence layer is configured to absorb │──── 102
│ the stress which is generated when the flexible display │
│ panel is bent, to convert the stress into the optical signal, │
│ and to emit the optical signal │
└─────────────────────────────────────────────────┘
```

FIG. 4

```
┌─────────────────────────────────────────────────┐
│ disposing a mechanoluminescence sub-layer on the side │──── 1021
│ of the light-emitting surface of the light-emitting layer │
└─────────────────────────────────────────────────┘
                          │
                          ▼
┌─────────────────────────────────────────────────┐
│ disposing a first hole transport layer on a side of the │
│ mechanoluminescence sub-layer away from light-emitting │──── 1022
│ layer │
└─────────────────────────────────────────────────┘
                          │
                          ▼
┌─────────────────────────────────────────────────┐
│ disposing a charge generation sub-layer on a side of the │──── 1023
│ first hole transport layer away from the light-emitting layer │
└─────────────────────────────────────────────────┘
                          │
                          ▼
┌─────────────────────────────────────────────────┐
│ disposing an electron transport sub-layer on a side of the │
│ charge generation sub-layer away from the light-emitting │──── 1024
│ layer │
└─────────────────────────────────────────────────┘
```

FLEXIBLE DISPLAY PANEL HAVING STRESS ABSORPTION FUNCTION AND MANUFACTURING METHOD OF FLEXIBLE DISPLAY PANEL

BACKGROUND OF INVENTION

Field of Invention

The present application relates to a field of display technology and particularly to a flexible display panel and a manufacturing method of the flexible display panel.

Description of Prior Art

Organic light-emitting diodes (OLEDs) have characteristics of high brightness, wide range of material selection, low driving voltage, fully solid state active light-emission, etc. and have advantages of high definition, wide viewing angle, and fast response speed, etc., which are compliant with development trend of mobile communication and information display in information age and requirements of green lighting technology, and are current focus of attention of many domestic and foreign researchers.

However, when current flexible organic light emitting diode devices are bent or folded, peeling off between cathodes of the OLED devices and OLED film layers easily occurs, causing a stress concentration region of the flexible display panels to easily fail.

SUMMARY OF INVENTION

One embodiment on the present application provides a flexible display panel, including:

a light-emitting layer, wherein the light-emitting layer includes a light-emitting surface; and a mechanoluminescence layer, wherein the mechanoluminescence layer is disposed on a side of the light-emitting surface of the light-emitting layer, and the mechanoluminescence layer is configured to absorb stress which is generated when the flexible display panel is bent, to convert the stress into an optical signal, and to emit the optical signal.

One embodiment of the present application further provides a manufacturing method of the flexible display panel, and the manufacturing method comprises:

manufacturing the light-emitting layer, wherein the light-emitting layer includes a light-emitting surface; and disposing a mechanoluminescence layer on a side of the light-emitting surface of the light-emitting layer, wherein the mechanoluminescence layer is configured to absorb stress which is generated when the flexible display panel is bent, to convert the stress into an optical signal, and to emit the optical signal.

The flexible display panel provided by embodiments of the present application includes the light-emitting layer and the mechanoluminescence layer. The mechanoluminescence layer is disposed on the side of the light-emitting surface of the light-emitting layer, and the mechanoluminescence layer is configured to absorb the stress which is generated when the flexible display panel is bent, to convert the stress into the optical signal, and to emit the optical signal. By converting part of the stress into light energy through the light-emitting layer, stress accumulation in the bending part is reduced, so that binding force between the cathode and the OLED film layer is relatively enhanced, thereby preventing peeling off between the cathode of the OLED device and the OLED film layer. Therefore, the problem that the stress concentration region of the flexible display panel being prone to failure is solved.

DETAILED DESCRIPTION OF EMBODIMENTS

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application.

In the description of the present application, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", "clockwise", "counter-clockwise" etc. is based on the orientation or positional relationship shown in the accompanying figures, which is merely for the convenience for describing of the present application and for the simplification of the description, and is not intended to indicate or imply that the indicated devices or elements have a specific orientation or is constructed and operated in a specific orientation. Therefore, it should not be understood as a limitation on the present application. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present application, the meaning of "a plurality" is two or more unless clearly and specifically defined otherwise.

When a flexible organic light emitting diode (OLED) device is bent or folded, a part of stress generated by bending of an upper encapsulation film layer and a module structure can be released to a cathode of the OLED device, a part of stress generated by bending of an upper encapsulation film layer and a module structure can be released to a cathode of the OLED device. Because binding force between the upper encapsulation film layer and the module structure of the OLED device is often higher than binding force between the cathode in the OLED device and an OLED film layer in the OLED device, the binding force between the cathode and the OLED film layer is relatively weak, making peeing off easily occur between the cathode of the OLED device and the OLED film layer, thereby causing a stress concentration region of the flexible display panel to easily fail.

Therefore, in order to solve the aforesaid problem, the present application provides a flexible display panel and a manufacturing method of the flexible display panel. The present application will be further described in detail below in combination with the drawings and embodiments.

Figure 1:
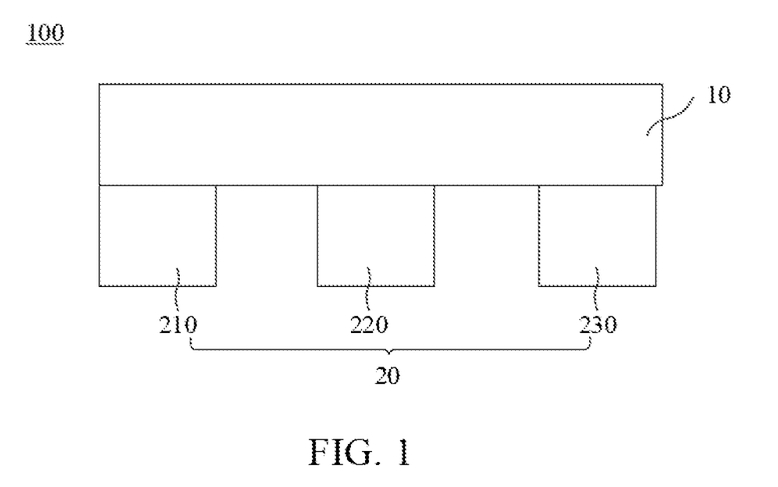
FIG. 1 is a first structural schematic diagram of a flexible display panel provided by one embodiment of the present application.

Please refer to FIG. 1. FIG. 1 is a first structural schematic diagram of a flexible display panel provided by one embodiment of the present application. One embodiment of the present application provides a flexible display panel 100. The flexible display panel 100 includes a light-emitting layer 20 and a mechanoluminescence layer 10. Wherein, the light-emitting layer 20 includes a light-emitting surface, and the mechanoluminescence layer 10 is disposed on a side of the light-emitting surface of the light-emitting layer 20, and the mechanoluminescence layer 10 is configured to absorb the stress which is generated when the flexible display panel 100 is bent, to convert the stress into the optical signal, and to emit the optical signal. In embodiments of the present application, by disposing the mechanoluminescence layer 10 on the side of the light-emitting surface of the light-emitting layer 20, the stress which is generated when the flexible display panel 100 is rolled or folded can be absorbed by the mechanoluminescence layer 10 and can be converted into the light energy and emitted. Not only damage to the light-emitting layer 20 incurred by stress during a folding or bending process can be buffered by the mechanoluminescence layer 10, but also light of the light-emitting layer 20 can be compensated by corresponding light emitted from the mechanoluminescence layer 10. In addition, under a same light-emitting intensity requirement, the flexible display panel 100 with the mechanoluminescence layer 10 can compensate for the light intensity emitted by the light-emitting layer 20, thereby reducing the light-emitting intensity of the light-emitting layer 20, and thereby prolonging service life light-emitting material in the light-emitting layer 20 and improving stability of the flexible display panel 100.

The light-emitting layer 20 includes red light-emitting units 210, green light-emitting units 220, and blue light-emitting units 230 spaced apart. Wherein, the red light-emitting units 210 are configured to emit red light, the green light-emitting units 220 are configured to emit green light, and the blue light-emitting units 230 are configured to emit blue light. The red light-emitting unit 210, the green light-emitting unit 220, and the blue light-emitting unit 230 can compose a smallest group for realizing white light. In the organic light-emitting display device, the red light-emitting unit 210, the green light-emitting unit 220, and the blue light-emitting unit 230 can be arranged repeatedly to display images.

Figure 2:
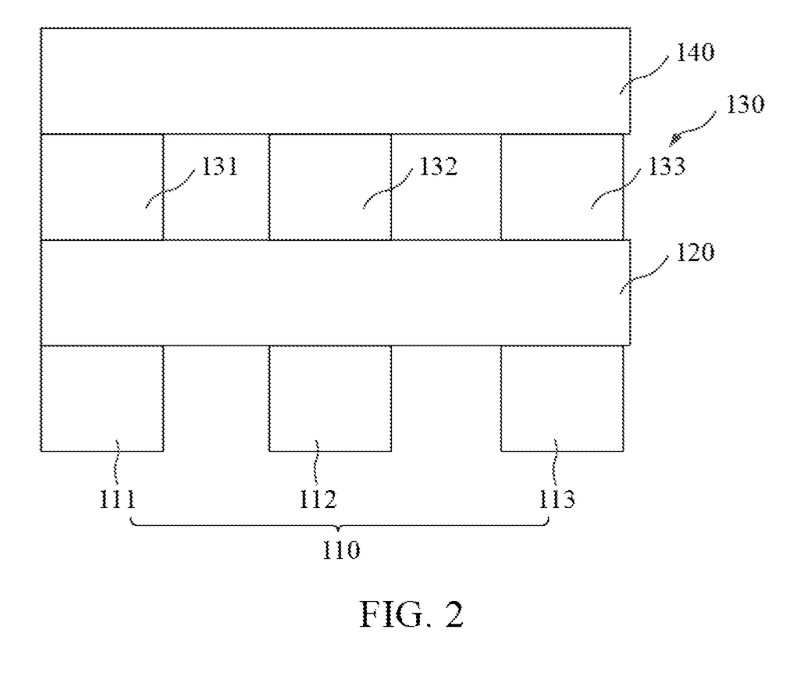
FIG. 2 is a structural schematic diagram of a mechanoluminescence layer in the flexible display panel provided by one embodiment of the present application.

Please continue referring to FIG. 2. FIG. 2 is a structural schematic diagram of a mechanoluminescence layer in the flexible display panel provided by one embodiment of the present application. The mechanoluminescence layer 10 includes a mechanoluminescence sub-layer 130. The mechanoluminescence sub-layer 130 has a mechanoluminescence (ML) effect. By coupling effect between a piezoelectric effect light excitability, conversion from mechanical stress to visible light emission is realized, i.e., an ML process. Wherein, mechanoluminescence (ML) refers to a phenomenon that an object converts mechanical energy into light energy through a series of conversions when applied to an external force. Regarding elastic mechanoluminescence materials, light emission of them generally has high repeatability. Furthermore, within a certain range, an intensity of a mechanoluminescence spectrum has a good linear relationship with the applied mechanical force.

The mechanoluminescence sub-layer 130 includes red mechanoluminescence units 131 disposed opposite to the red light-emitting units 210, green mechanoluminescence units 132 disposed opposite to the green light-emitting units 220, and blue mechanoluminescence units 133 disposed opposite to the blue light-emitting units 230. For example, the red mechanoluminescence unit 131 absorbs stress and converts the stress into red light and emits the red light, the green mechanoluminescence unit 132 absorbs stress and converts the stress into green light and emits the green light, and the blue mechanoluminescence unit 133 absorbs stress and converts the stress into blue light and emits the blue light. By disposing the mechanoluminescence sub-layer 130 corresponding to the light-emitting layer 20, the light-emitting intensity of the light-emitting layer 20 can be compensated, and the service life of the light-emitting material in the light-emitting layer 20 can be prolonged.

A light-emitting area of the red light-emitting units 210, a light-emitting area of the green light-emitting units 220, and a light-emitting area of the blue light-emitting units 230 in the mechanoluminescence units can be respectively consistent or not consistent with the light-emitting areas of the red mechanoluminescence units 131, the green mechanoluminescence units 132, the blue mechanoluminescence units 133. For example, the light-emitting area of the red light-emitting units 210 is less than or equal to the light-emitting area of the red mechanoluminescence units 131, the light-emitting area of the green light-emitting units 220 is less than or equal to the light-emitting area of the green mechanoluminescence units 132, and the light-emitting area of the blue light-emitting units 230 is less than or equal to the light-emitting area of the blue mechanoluminescence units 133.

In some embodiments, the light-emitting area of the red light-emitting units 210 and the light-emitting area of the red mechanoluminescence units 131 are same, the light-emitting area of the green light-emitting units 220 and the light-emitting area of the green mechanoluminescence units 132 are same, and the light-emitting area of the blue light-emitting units 230 and the light-emitting area of the blue mechanoluminescence units 133 are same. By making the light-emitting area of the red light-emitting units 210, the light-emitting area of the green light-emitting units 220, and the light-emitting area of the green light-emitting units 230 to be consistent with the light-emitting areas of the red mechanoluminescence units 131, the green mechanoluminescence units 132, and the blue mechanoluminescence units 133, the stress absorbed by the sub-mechanoluminescence layer 130 can be made more comprehensive. Therefore, the light-emitting layer 20 can be protected more comprehensively, and the light-emitting layer 20 can be prevented from being affected by the stress.

In some other embodiments, the light-emitting area of the red light-emitting units 210 is greater than the light-emitting area of the red mechanoluminescence units 131, the light-emitting area of the green light-emitting units 220 is greater than the light-emitting area of the green mechanoluminescence units 132, and the light-emitting area of the blue light-emitting units 230 is greater than the light-emitting area of the blue mechanoluminescence units 133. In another example, the light-emitting area of the red light-emitting units 210 is less than the light-emitting area of the red mechanoluminescence units 131, the light-emitting area of the green light-emitting units 220 is less than the light-emitting area of the green mechanoluminescence units 132, and the light-emitting area of the blue light-emitting units 230 is less than the light-emitting area of the blue mechanoluminescence units 133, etc. It can be understood that relations of sizes of the light-emitting area of the red light-emitting units 210, the light-emitting area of the green light-emitting units 220, and the light-emitting area of the blue light-emitting units 230 in the mechanoluminescence units being respective to the light-emitting areas of the red mechanoluminescence units 131, the green mechanoluminescence units 132 and the blue mechanoluminescence units 133 can be configured according to actual situations, which are not specifically limited herein. It only needs to ensure that the mechanoluminescence layer 10 is disposed on the side of the light-emitting surface of the light-emitting layer 20.

The mechanoluminescence sub-layer 130 can include one or combination of $ZnS:Mn^{2+}$, $ZnS:Cu^{2+}$, tetraphenylethylene, which emission wavelength matches red, green, and blue (RGB) light emitting requirements.

The mechanoluminescence layer 10 further includes an electron transport sub-layer 140, a charge generation sub-layer 110, and a first hole transport layer 120. Wherein, the electron transport sub-layer 140 is disposed on a side of the mechanoluminescence sub-layer 130 away from the light-emitting layer 20, and the electron transport sub-layer 140 is configured to provide electrons to the mechanoluminescence sub-layer 130. The charge generation sub-layer 110 is disposed on a side of the mechanoluminescence sub-layer 130 away from the electron transport sub-layer 140, and the charge generation sub-layer is configured to provide electrons to the charge generation sub-layer 140. The first hole transport layer 120 is disposed between the charge generation sub-layer 110 and the mechanoluminescence sub-layer 130 and is configured to transmit electron holes of the charge generation sub-layer 110 to the mechanoluminescence sub-layer 130.

It should be noted that the charge generation sub-layer 110 has different n-type doping concentrations or organic p-type doping concentrations in different distribution regions. Because stress generated by the flexible display panel 100 is different when it is rolled or folded, the light-emitting intensity generated by the mechanoluminescence sub-layer 130 through absorbing the stress is inconsistent, resulting in the light emitting intensity of the mechanoluminescence sub-layer 130 also being in a certain regional distribution, thereby making the flexible display panel 100 to emit light unevenly. Therefore, in embodiments of the present application, by disposing different doping concentrations of the charge generation sub-layer 110 according to the stress distribution, the charge generation sub-layer 110 with different doping concentrations generates different electron energies to the mechanoluminescence sub-layer 130 under a same driving voltage to compensate the problem of different light-emitting intensity of the light-emitting sub-layer incurred by different stresses, thereby making the flexible display panel 100 to emit light uniformly.

For example, the charge generation sub-layer 110 includes a first charge generation layer 111 disposed opposite to the red light-emitting units 210, a second charge generation layer 112 disposed opposite to the green light-emitting units 220, and a third charge generation layer 230 disposed opposite to the blue light-emitting unit 113. When stress of a region corresponding to the green light-emitting unit 220 is greater than stress of a region corresponding to the red light-emitting unit 210 and stress of a region corresponding to the blue light-emitting unit 230, a doping ratio of the first charge generation layer 111 and a doping ratio of the third charge generation layer 113 are both smaller than a doping ratio of the second charge generation layer 112.

In another example, the flexible display panel 100 includes a bending region. Stress in a central region of the bending region is greater than stress on a lateral side of the bending region, and a doping concentration of the charge generation sub-layer 110 on the lateral side of the bending region is the best. The doping concentration of the charge generation sub-layer 110 gradually increases or gradually decreases along a direction from the lateral side of the bending region to the central region.

Wherein, the doping concentration of the charge generation sub-layer 110 gradually increases or gradually decreases along the direction from the lateral side of the bending region to the central region. It can be understood that, because the doping concentration of the charge generation sub-layer 110 corresponding to the region with low stress is the best, when the doping concentration of the charge generation sub-layer 110 corresponding to the region with high stress gradually increases or decreases, efficiency of the charge generating by the charge generation sub-layer 110 can gradually decrease. Therefore, the electron generation efficiency of the charge generation sub-layer 110 located in the region with low stress can be higher than that of the charge generation sub-layer 110 corresponding to the region with high stress.

It can be understood that, because the stress in the central region of the bending region is greater than the stress on the lateral side of the bending region, light energy intensity emitted by the mechanoluminescence sub-layer 130 located in the central region of the bending region is greater than that of the mechanoluminescence sub-layer 130 located on the lateral side of the bending region, resulting in uneven light emission of the display panel. Furthermore, by configuring the doping concentration of the charge generation sub-layer 110 on the lateral side of the bending region to be the best, more charges can be generated from the charge generation sub-layer 110 and transferred to the mechanoluminescence sub-layer 130 and the light-emitting layer 20, so light-emitting intensity of the mechanoluminescence sub-layer 130 and the luminescent layer 20 can be increased. Therefore, the light-emitting intensity of the central region of the bending region can be made close to the light-emitting intensity on the lateral side of the bending region, thereby solving the problem of uneven light emission incurred by different stresses.

Wherein, the best doping concentration of the charge generation sub-layer 110 refers to making the best current efficiency of the red mechanoluminescence unit 131 to range from 40-60 cd/A, making the best current efficiency of the green mechanoluminescence unit 132 to range from 100-150 cd/A, and making the best current efficiency of the blue mechanoluminescence unit 133 ranges from 5-10 cd/A.

It can be understood that when the flexible display panel 100 is a foldable screen, the mechanoluminescence layer 10 is disposed on a folding surface, and the doping concentration of the charge generation sub-layer 110 is distributed along the folding surface, i.e., the smaller the stress on the folding surface is, and the doping concentration of the charge generation sub-layer 110 is the best.

When the flexible display panel 100 is a scroll screen, the doping concentration of the charge generation sub-layer 110 is distributed along a radial direction of a curved circular axis, i.e., the smaller the stress on a scroll surface is, the doping concentration of the charge generation sub-layer 110 is the best.

The doping concentration of the charge generation sub-layer 110 ranges from 1% to 30%.

It should be noted that a plurality of mechanoluminescence layers 10 stacked with each other are disposed on the side of the light-emitting surface of the light-emitting layer 20. By the plurality of mechanoluminescence layers 10 stacked with each, the problem that the stress concentration region is prone to failure can be relieved better.

Figure 3:
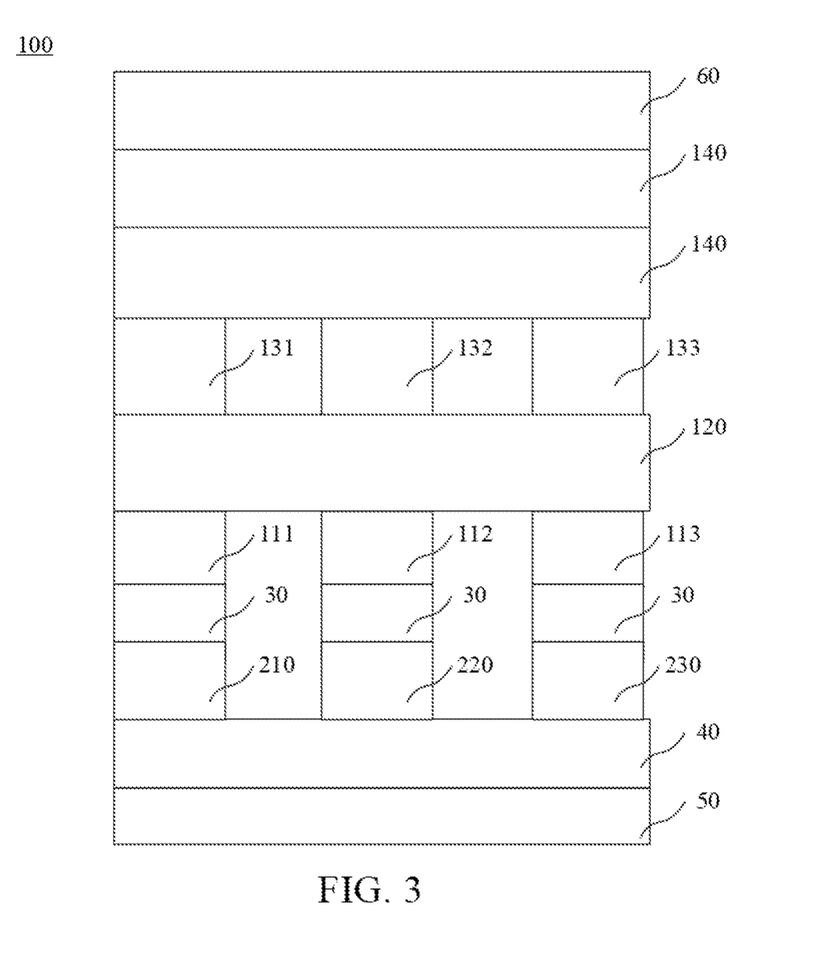
FIG. 3 is a second structural schematic diagram of the flexible display panel provided by one embodiment of the present application.

Please continue referring to FIG. 3. FIG. 3 is a second structural schematic diagram of the flexible display panel provided by one embodiment of the present application. The flexible display panel 100 in one embodiment of the present application further includes a first electrode 50, an electron transport layer 30, a second hole transport layer 40, and a second electrode 60. Wherein, the first electrode 50 is disposed on a side of the light-emitting layer 20 away from the mechanoluminescence layer 10, and the first electrode 50 can be an electrode that provides electron holes to the light-emitting layer 20, and can be referred to as an anode. The second hole transport layer 40 is disposed between the light-emitting layer 20 and the first electrode 50 and is configured to transmit electron holes of the first electrode 50 to the light-emitting layer 20. The second electrode 60 is disposed on a side of the mechanoluminescence layer 10 away from the first electrode 50, and the second electrode 60 is a cathode.

Figure 4:
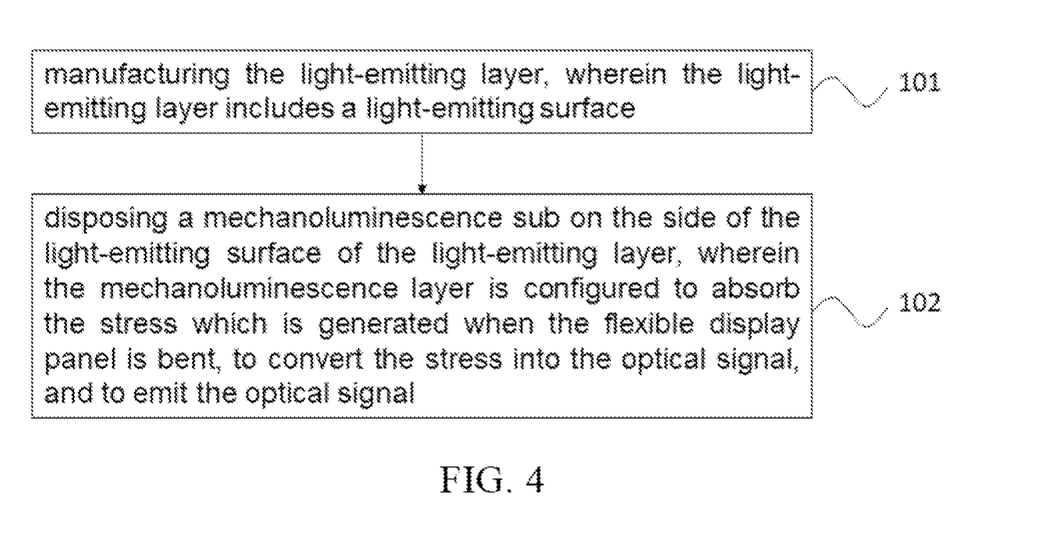
FIG. 4 is a first flowchart of a manufacturing method of the flexible display panel provided by one embodiment of the present application.

Please continue referring to FIG. 4. FIG. 4 is a first flowchart of a manufacturing method of the flexible display panel provided by one embodiment of the present application. One embodiment of the present application provides a manufacturing method of the flexible display panel, which is applied in the flexible display panel 100. Specific processes a manufacturing method of the flexible display panel 100 are as follows.

101: manufacturing the light-emitting layer, wherein the light-emitting layer includes a light-emitting surface.

The light-emitting layer 20 is manufactured by using a deposition manner. Wherein, the light-emitting layer 20 includes red light-emitting units 210, green light-emitting units 220, and blue light-emitting units 230 spaced apart. The specific structures of the light-emitting layer 20 are shown above, and redundant description will not be mentioned herein again.

102: disposing a mechanoluminescence sub on the side of the light-emitting surface of the light-emitting layer, wherein the mechanoluminescence layer is configured to absorb the stress which is generated when the flexible display panel is bent, to convert the stress into the optical signal, and to emit the optical signal.

Figure 5:
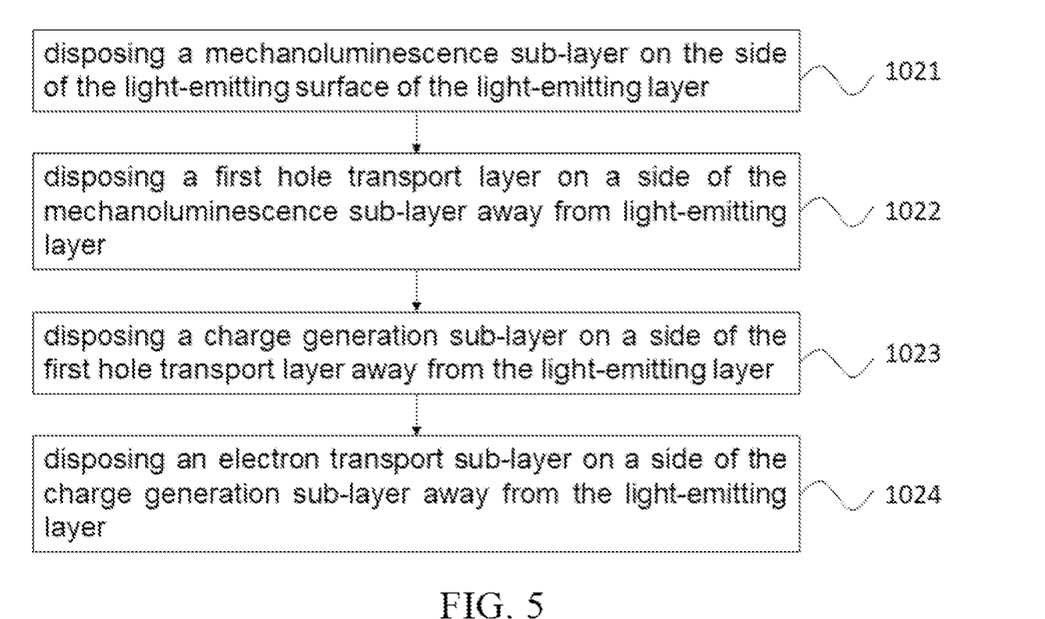
FIG. 5 is a flowchart of manufacturing the mechanoluminescence layer in the manufacturing method illustrated in FIG. 4.

By disposing the mechanoluminescence layer 10 on the side of the light-emitting surface of the light-emitting layer 20, by absorbing the stress which is generated when the flexible display panel 100 is bent, converting the stress into the optical signal, and emitting the optical signal through the mechanoluminescence layer 10, the damage to the flexible display panel 100 from the stress can be reduced. Configuration of the mechanoluminescence layer 10 is specifically illustrated in FIG. 5. FIG. 5 is a flowchart of manufacturing the mechanoluminescence layer in the manufacturing method illustrated in FIG. 4. Specific processes are as follows.

1021: disposing a mechanoluminescence sub-layer on the side of the light-emitting surface of the light-emitting layer.

The mechanoluminescence sub-layer 130 is manufactured on the side of the light-emitting surface of the light-emitting layer 20 by using a printing manner or an evaporation deposition manner. For example, red mechanoluminescence units 131 are disposed on a side of a light-emitting surface of the red light-emitting units 210, green mechanoluminescence units 132 are disposed on a side of a light-emitting surface of the green light-emitting units 220, and blue mechanoluminescence units 133 are disposed on a side of a light-emitting surface of the blue light-emitting units 230. Wherein, one or combination of $ZnS:Mn^{2+}$, $ZnS:Cu^{2+}$, tetraphenylethylene can used in the mechanoluminescence sub-layer 130, which emission wavelength matches red, green, and blue (RGB) light emitting requirements.

1022: disposing a first hole transport layer on a side of the mechanoluminescence sub-layer away from light-emitting layer.

A first hole transport layer 120 is deposited on a side of the mechanoluminescence sub-layer 130 away from light-emitting layer 20. The first hole transport layer 120 is configured to transmit electron holes of the charge generation sub-layer 110 to the mechanoluminescence sub-layer 130.

1023: disposing a charge generation sub-layer on a side of the first hole transport layer away from the light-emitting layer.

The charge generation sub-layer 110 can be manufactured by a solution method. Wherein, the charge generation sub-layer 110 has different n-type doping concentrations or organic p-type doping concentrations in different distribution regions. Stress of a central region of the bending region of the display panel is greater than a stress on a lateral side of the bending region. The doping concentration of the charge generation sub-layer 110 gradually increases or gradually decreases along the direction from the lateral side of the bending region to the central region, i.e., the smaller the stress on the distribution region is, the doping concentration of the charge generation sub-layer 110 is the best. Specific analysis of is shown as above, and redundant description will not be mentioned herein again.

1024: disposing an electron transport sub-layer on a side of the charge generation sub-layer away from the light-emitting layer.

The electron transport sub-layer 140 is deposited on a side of the charge generation sub-layer 110 away from the light-emitting layer 20 and is configured to provide electrons to the mechanoluminescence sub-layer 130.

Figure 6:
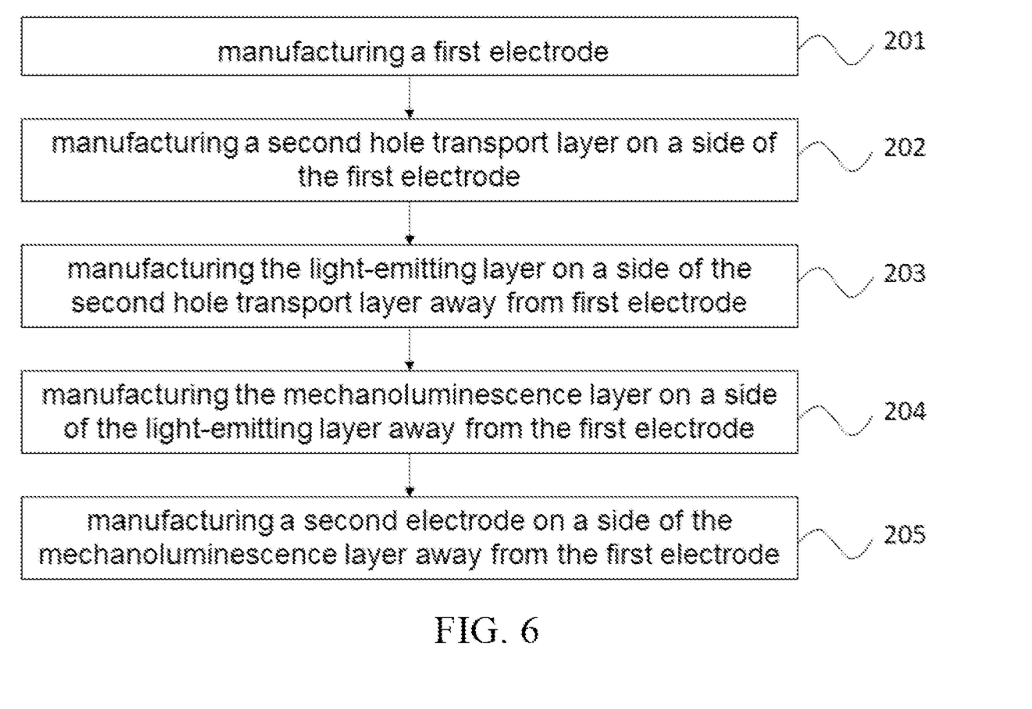
FIG. 6 is a second flowchart of the manufacturing method of the flexible display panel provided by one embodiment of the present application.

Please continue referring to FIG. 6. FIG. 6 is a second flowchart of the manufacturing method of the flexible display panel provided by one embodiment of the present application. One embodiment of the present application further provides the manufacturing method of the flexible display panel, and specific processes are as follows.

201: manufacturing a first electrode.

The first electrode 50 can be an electrode that provides electron holes to the light-emitting layer 20 and can be referred to as an anode.

202: manufacturing a second hole transport layer on a side of the first electrode.

The second hole transport layer 40 is deposited on the first electrode 50. The second hole transport layer 40 is used to transmit electron holes of the first electrode 50 out.

203: manufacturing the light-emitting layer on a side of the second hole transport layer away from first electrode.

The red light-emitting units 210, the green light-emitting units 220, and the blue light-emitting units 230 are respectively deposited on the side of the second hole transport layer 40 away from the first electrode 50. The specific please refer to the aforesaid step 201, and redundant description will not be mentioned herein again.

204: manufacturing the mechanoluminescence layer on a side of the light-emitting layer away from the first electrode.

The electron transport layer is deposited on the red light-emitting units 210, the green light-emitting units 220, and the blue light-emitting units 230 of the light-emitting layer 20.

The mechanoluminescence layer 10 is manufactured on a side of the electron transport layer 30 away from the first electrode 50, the specific please refer to the aforesaid step 102, and unnecessary details will not be given herein again.

205: manufacturing a second electrode on a side of the mechanoluminescence layer away from the first electrode.

The second electrode 60 is manufactured on the side of the electron transport sub-layer 140 of the mechanoluminescence layer 10 away from the first electrode 50. Wherein, the second electrode 60 is a cathode.

In embodiments of the present application, by adding the mechanoluminescence layer 10 in the flexible display panel 100, by absorbing the stress which is generated when the flexible display panel 100 is bent and to convert the stress into the optical signal and emitting the optical signal by the mechanoluminescence layer 10 the stress accumulation of the bending part is reduced, and the light intensity emitted by the light-emitting layer 20 is compensated. The service life of the light-emitting material in the light-emitting layer 20 is prolonged, and the stability of the flexible display panel 100 is improved. In addition, in order to avoid uneven light emission of the mechanoluminescence layer 10 due to uneven stress distribution, the embodiments of the present application further provides the charge generation sub-layer 110 having different n-type or organic p-type doping concentrations designed according to different stress distribution regions in the flexible display panel 100 to compensate for the light-emitting intensity, which makes flexible display panel 100 emit uniform light intensity.

The flexible display panel and the manufacturing method of the flexible display panel provided by the embodiments of the present application are described in detail above. The principle and implementation manner of present application are described herein with reference to specific embodiments. The foregoing descriptions of the embodiments are merely used for better understanding of the present application. Meanwhile, for a person of ordinary skill in the art can make variations and modifications to the specific implementation manner and application scope according to the idea of this application. In summary, contents of the specification shall not be construed as a limitation to this application.

What is claimed is:

1. A flexible display panel, comprising:
   a light-emitting layer, wherein the light-emitting layer comprises a light-emitting surface;
   a mechanoluminescence layer, wherein the mechanoluminescence layer is disposed on a side of the light-emitting surface of the light-emitting layer, and the mechanoluminescence layer is configured to absorb stress generated which is when the flexible display panel is bent, to convert the stress into an optical signal, and to emit the optical signal;
   wherein the mechanoluminescence layer comprises:
   a mechanoluminescence sub-layer;
   an electron transport sub-layer, wherein the electron transport sub-layer is disposed on a side of the mechanoluminescence sub-layer away from the light-emitting layer, and the electron transport sub-layer is configured to provide electrons to the mechanoluminescence sub-layer;
   a charge generation sub-layer, the charge generation sub-layer is disposed on a side of the mechanoluminescence sub-layer away from the electron transport sub-layer, and the charge generation sub-layer is configured to provide electrons to the charge generation sub-layer; and
   a first hole transport layer, wherein the first hole transport layer is disposed between the charge generation sub-layer and the mechanoluminescence sub-layer and is configured to transmit electron holes of the charge generation sub-layer to the mechanoluminescence sub-layer.

2. The flexible display panel as claimed in claim 1, wherein the flexible display panel comprises a bending region, stress of a central region of the bending region is greater than a stress on a lateral side of the bending region, and a doping concentration of the charge generation sub-layer gradually increases or gradually decreases along a direction from the lateral side of the bending region to the central region.

3. The flexible display panel as claimed in claim 2, wherein the charge generation sub-layer has different n-type doping concentrations or organic p-type doping concentrations in different distribution regions.

4. The flexible display panel as claimed in claim 3, wherein the doping concentration of the charge generation sub-layer ranges from 1% to 30%.

5. The flexible display panel as claimed in claim 1, wherein the light-emitting layer comprises red light-emitting units, green light-emitting units, and blue light-emitting units spaced apart, the mechanoluminescence sub-layer comprises red mechanoluminescence units disposed opposite to the red light-emitting units, green mechanoluminescence units disposed opposite to the green light-emitting units, and blue mechanoluminescence units disposed opposite to the blue light-emitting units.

6. The flexible display panel as claimed in claim 5, wherein a light-emitting area of the red light-emitting units is less than or equal to a light-emitting area of the red mechanoluminescence units, a light-emitting area of the green light-emitting units is less than or equal to a light-emitting area of the green mechanoluminescence units, and a light-emitting area of the blue light-emitting units is less than or equal to a light-emitting area of the blue mechanoluminescence units.

7. The flexible display panel as claimed in claim 1, wherein the mechanoluminescence sub-layer comprises at least one selected from the group consisting of ZnS:Mn2+, ZnS:Cu2+, and tetraphenylethylene.

8. The flexible display panel as claimed in claim 1, wherein a plurality of mechanoluminescence layers stacked with each other are disposed on the side of the light-emitting surface of the light-emitting layer.

9. The flexible display panel as claimed in claim 1, wherein the flexible display panel comprises:
   a first electrode, wherein the first electrode is disposed on a side of the light-emitting layer away from the mechanoluminescence layer;
   a second hole transport layer, wherein the second hole transport layer is disposed between the light-emitting layer and the first electrode and is configured to transmit electron holes of the first electrode to the light-emitting layer; and a second electrode, wherein the second electrode is disposed on a side of the mechanoluminescence layer away from the first electrode.

10. A manufacturing method of a flexible display panel, wherein the manufacturing method comprises:
  manufacturing the light-emitting layer, wherein the light-emitting layer comprises a light-emitting surface; and
  disposing a mechanoluminescence layer on a side of the light-emitting surface of the light-emitting layer, wherein the mechanoluminescence layer is configured to absorb stress generated which is when the flexible display panel is bent, to convert the stress into an optical signal, and to emit the optical signal;
  wherein disposing the mechanoluminescence layer on the side of the light-emitting surface of the light-emitting layer comprises:
  disposing a mechanoluminescence sub-layer on the side of the light-emitting surface of the light-emitting layer,
  disposing a first hole transport layer on a side of the mechanoluminescence sub-layer away from light-emitting layer;
disposing a charge generation sub-layer on a side of the first hole transport layer away from the light-emitting layer; and
  disposing an electron transport sub-layer on a side of the charge generation sub-layer away from the light-emitting layer.

11. The manufacturing method as claimed in claim 10, wherein disposing the mechanoluminescence sub-layer on the side of the light-emitting surface of the light-emitting layer comprises:
  using a printing manner or an evaporation deposition manner to manufacture the mechanoluminescence sub-layer on the side of the light-emitting surface of the light-emitting layer.

12. The manufacturing method as claimed in claim 10, wherein the light-emitting layer comprises red light-emitting units, green light-emitting units, and blue light-emitting units spaced apart, the mechanoluminescence sub-layer comprises red mechanoluminescence units disposed opposite to the red light-emitting units, green mechanoluminescence units disposed opposite to the green light-emitting units, and blue mechanoluminescence units disposed opposite to the blue light-emitting units.

13. The manufacturing method as claimed in claim 12, wherein a light-emitting area of the red light-emitting units is less than or equal to a light-emitting area of the red mechanoluminescence units, a light-emitting area of the green light-emitting units is less than or equal to a light-emitting area of the green mechanoluminescence units, and a light-emitting area of the blue light-emitting units is less than or equal to a light-emitting area of the blue mechanoluminescence units.

14. The manufacturing method as claimed in claim 10, wherein the mechanoluminescence sub-layer comprises at least one selected from the group consisting of ZnS:Mn2+, ZnS:Cu2+, and tetraphenylethylene.

15. The manufacturing method as claimed in claim 10, wherein the flexible display panel comprises a bending region, stress of a central region of the bending region is greater than a stress on a lateral side of the bending region, and a doping concentration of the charge generation sub-layer gradually increases or gradually decreases along a direction from the lateral side of the bending region to the central region.

16. The manufacturing method as claimed in claim 15, wherein the charge generation sub-layer has different n-type doping concentrations or organic p-type doping concentrations in different distribution regions.

17. The manufacturing method as claimed in claim 16, wherein the doping concentration of the charge generation sub-layer ranges from 1% to 30%.

18. The manufacturing method as claimed in claim 10, wherein the manufacturing method comprises:
  a plurality of mechanoluminescence layers stacked with each other are disposed on the side of the light-emitting surface of the light-emitting layer.

* * * * *